United States Patent [19]
Jen et al.

[11] Patent Number: 6,103,608
[45] Date of Patent: Aug. 15, 2000

[54] METHOD OF FORMING A CONTACT WINDOW

[75] Inventors: Yi-Min Jen, Taipei; Chung-Hsien Wu, Hsinchu, both of Taiwan

[73] Assignee: United Integrated Circuit Corp., Hsinchu, Taiwan

[21] Appl. No.: 09/062,661

[22] Filed: Apr. 20, 1998

[51] Int. Cl.$^7$ ...................... H01L 21/336; H01L 21/4763
[52] U.S. Cl. .......................... 438/592; 438/279; 438/301; 438/303; 438/305; 438/585
[58] Field of Search ..................................... 438/592, 305, 438/279, 585, 301, 303

[56] References Cited

U.S. PATENT DOCUMENTS

| | | | |
|---|---|---|---|
| 5,670,401 | 9/1997 | Tseng | 437/44 |
| 5,817,562 | 10/1998 | Chang et al. | 438/305 |
| 5,854,135 | 12/1998 | Ko | 438/712 |
| 5,907,789 | 5/1999 | Komatsu | 438/649 |

*Primary Examiner*—Richard Booth
*Assistant Examiner*—Alexander G. Ghyka
*Attorney, Agent, or Firm*—Pillsbury Madison & Sutro Intellectual Property Group

[57] ABSTRACT

The present invention discloses a method of forming a contact window on a substrate. The method in the present invention includes a step of forming a gate structure on said substrate having a gate oxide, a gate electrode on the gate oxide, and a gate electrode protection layer on the gate electrode, a step of forming a protection layer conforming with the substrate and the gate structure, and a step of forming a first insulation layer over the protection layer. The method further includes removing a portion of the first insulation layer and a portion of the protection layer for forming side wall spacers at side walls of the gate structure, performing a ion implantation to the substrate using the gate structure and the side wall spacers as a mask, and then forming a second insulation layer on the substrate, the side wall spacers, and the gate structure. The method further includes patterning a photoresist layer on the second insulation layer to expose a portion of second insulation layer for making a connection. Finally, a portion of the second insulation layer is removed for forming a contact window.

10 Claims, 5 Drawing Sheets

METHOD OF FORMING A CONTACT WINDOW

FIELD OF THE INVENTION

The present invention relates to semiconductors, and more specifically, to a method of forming a self-aligned contact window in semiconductor manufacturing processes.

BACKGROUND OF THE INVENTION

With the progress in the semiconductor integrated circuits, from LSI (large scale integration), VLSI (very large scale integration), to ULSI (ultra large scale integration), the integrity of the integrated circuits rises in an amazing rate. Taking DRAM (dynamic random access memories) for example, the increasing integrity in manufacturing extends the capacity of a single DRAM chip to step from earlier 4 megabit to 16 megabit, and further to 256 megabit or even higher. The increasing integrity of integrated circuits generates numerous challenges with semiconductor manufacturing process. Every element needs to be formed within smaller area without influencing the characteristics and operations of the integrated circuits. One important challenge is in the wiring technology for forming metal connections within smaller space with uncompromising electric characteristics.

In conventional semiconductor manufacturing processes, various methods have been developed, for making a contact window within a narrow space between the gates of the device like a MOS (metal-oxide semiconductor). A SAC (self-alignment contact) technology without using a mask is now widely employed in the semiconductor manufacturing processes. The SAC technology is applied frequently in making a contact window 24 between the gates as shown in FIG. 1e. FIG. 1a shows a semiconductor substrate 10 with a gate structure 11 formed upon. The gate structure 11 has a gate oxide 12, a gate electrode 14 formed above the gate oxide, and a gate electrode protection layer 16 formed above the gate electrode. The formation of the gate structure 11 is well known in the art of semiconductor manufacturing process. The substrate 10 is prepared for proceeding following steps like forming active regions of the integrated circuits and making connections. As shown in FIG. 1b, side wall spacers 18 are then formed around the gate by sequentially depositing and anisotropically etching a first insulation layer of silicon dioxide. An ion implantation using the gate structure 11 and the side wall spacers 18 as a mask is then performed to the whole substrate 10. The uncovered spaces between the side wall spacers are ion-implanted for forming active regions such as source regions or drain regions of the integrated circuits.

A second insulation layer 20 is then covered as an IPD (inter-polysilicon dielectric) layer as shown in FIG. 1c. The second insulation layer 20 insulates the gates and other non connecting regions from making a conductive connection. The second insulation layer 20 is generally formed by depositing a silicon dioxide layer. A photoresist layer 22 is formed on the second insulation layer 20 and portions of the photoresist layer 22 is removed, for defining a connecting region as shown in FIG. 1d. An anisotropic etching process employing the photoresist layer as a mask is performed to the second insulation layer 20. Since the etching process is anisotropic, a width of a contact window 24 are defined by controlling the etching of the second insulation layer 20, as shown in FIG. 1e. The process of forming the contact window 24 is a self-aligned etching process and portions of the second insulation layer is left aside the side wall spacers 18 as second side wall spacers 20b. Finally, a connection layer 26 of doped polysilicon or metal is then deposited to fill the contact window 24 as a conductive connection to the active region, as shown in FIG. 1f.

Referring to FIG. 1e, the contact window is formed by a self-aligned, anisotropic etching of the second insulation layer. With the low exchange rate of etchant at a narrow region like the contact window 24 and under the consideration of over etching, the second side wall spacers 20b are left from incompletely etching. The presence of the second side wall spacers 20b reduce the contact window width for making a connection. The reduction in the contact window width has a great influence on the design rule controlling the space between the gates. The contact window width becomes a vital limit in raising the integrity of the integrated circuits. In addition, in the aforementioned process, the steps of etching the first insulation layer and of etching the second insulation layer 20 must be carefully controlled. Over etching during the processes may expose the gate electrode 14 at the side walls. The undesired exposing of the gate electrode 14 causes current leakage and forms unexpected short connections with a connection layer formed later. The leakage and short connections decrease the reliability or even crash some devices of the semiconductor. The process must be well controlled, or the undesired short will reduce the manufacturing yield and increase the manufacturing cost. Thus a method is needed for providing better wiring technology in making wider contact window and reducing the space needed between the gates. A solution to the over etching problem is also needed for increasing the reliability and reducing the manufacturing cost of the integrated circuits manufacturing.

SUMMARY OF THE INVENTION

The present invention discloses a method of forming a contact window. The method provides a self-aligned process in making a wider contact window with lower contact resistance, without an additional mask in the semiconductor manufacturing process. The method changes the design rule by providing a closer space between the gates and the integrity of the integrated circuits can be increased by applying the method.

The present invention provides the method of forming a contact window between the gates. The method in the present invention includes a step of forming a gate structure on said substrate having a gate oxide, a gate electrode on the gate oxide, and a gate electrode protection layer on the gate electrode, a step of forming a protection layer conforming with the substrate and the gate structure, and a step of forming a first insulation layer over the protection layer. The method further includes removing a portion of the first insulation layer and a portion of the protection layer for forming side wall spacers at side walls of the gate structure, performing a ion implantation to the substrate using the gate structure and the side wall spacers as a mask, and then forming a second insulation layer on the substrate, the side wall spacers, and the gate structure. The method further includes patterning a photoresist layer on the second insulation layer to expose a portion of second insulation layer for making a connection. Finally, a portion of the second insulation layer is removed for forming a contact window.

Therefore, a contact window to an active region on the substrate like a source region or a drain region for making conductive connections is formed. The materials like doped polysilicon, metal, or other conductive materials can be deposited to the contact window for making a connection.

The method in the present invention provides a wider contact window width than conventional SAC technology. With the self-aligned method in the present invention, the space between the gates can be reduced for forming the same line width. The integrity of the integrated circuits can be raised with the self-aligned method. The contact window width can be controlled accurately without an additional mask in a conventional manufacturing process. With the employment of the protection layer, the possibility of short connections caused by over etching can be eliminated.

BRIEF DESCRIPTION OF THE DRAWINGS

The foregoing aspects and many of the attendant advantages of this invention will become more readily appreciated and better understood by referencing the following detailed description, when taken in conjunction with the accompanying drawings, wherein.

DETAILED DESCRIPTION OF THE PREFERRED EMBODIMENT

Figure 1A:
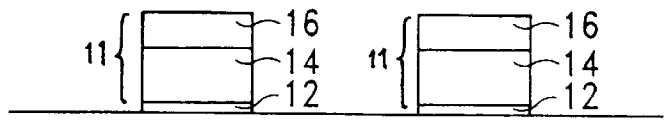
FIG. 1a illustrates a cross sectional view of a substrate with a gate structure.
Figure 1B:
FIG. 1b illustrates a cross sectional view of forming side wall spacers on the substrate in the prior art.
Figure 1C:
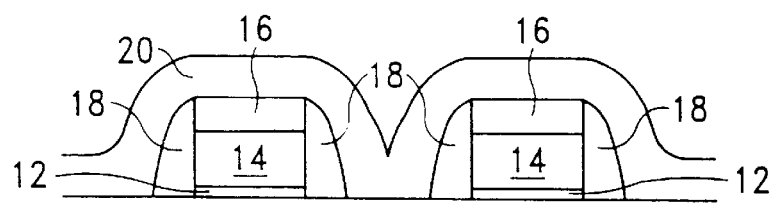
FIG. 1c illustrates a cross sectional view of forming a second insulation layer on the substrate in the prior art.
Figure 1D:
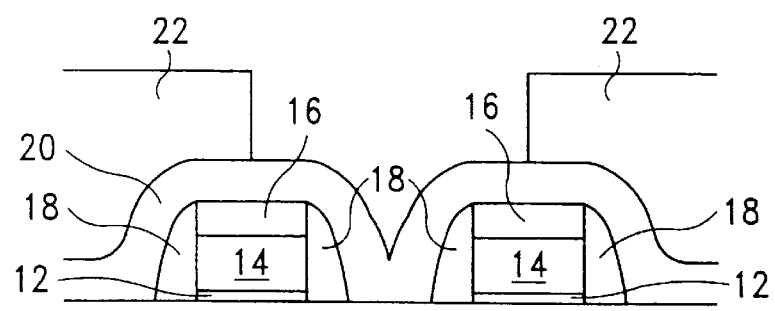
FIG. 1d illustrates a cross sectional view of patterning a photoresist on the second insulation layer in the prior art.
Figure 1E:
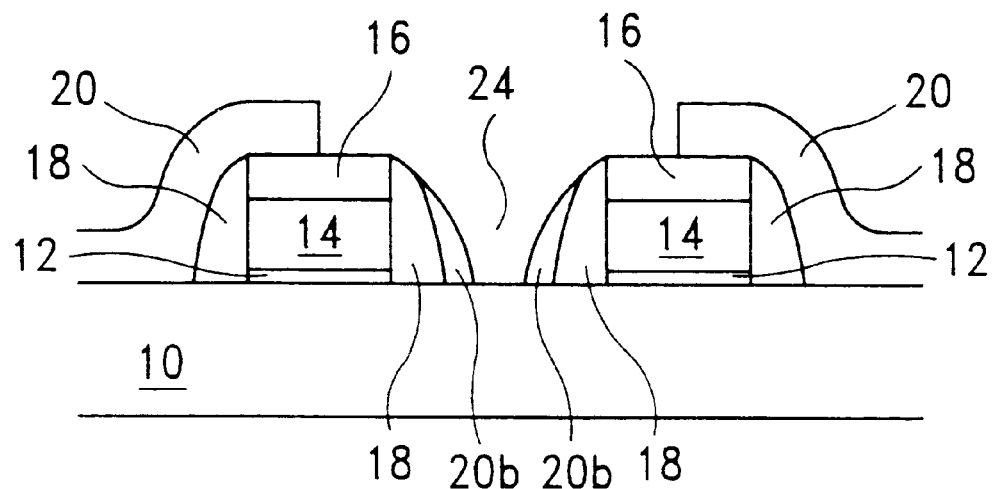
FIG. 1e illustrates a cross sectional view of forming a contact window to the substrate in the prior art.
Figure 1F:
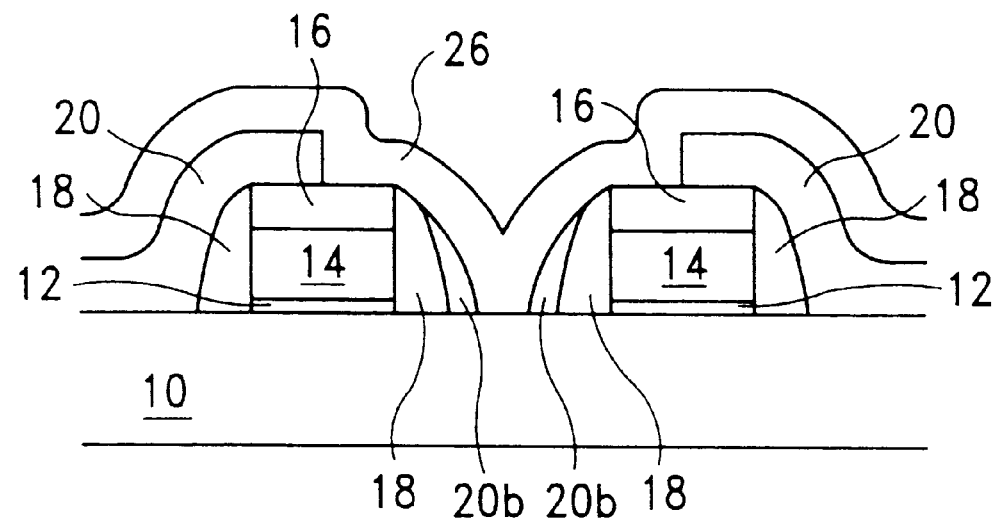
FIG. 1f illustrates a cross sectional view of forming a connection layer within the contact window and on the substrate in the prior art.
Figure 2A:
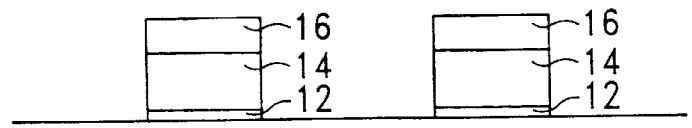
FIG. 2a illustrates a cross sectional view of a substrate with a gate structure.
Figure 2B:
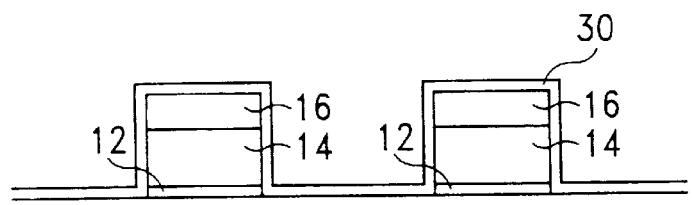
FIG. 2b illustrates a cross sectional view of forming a protection layer on the substrate in the present invention.
Figure 2C:
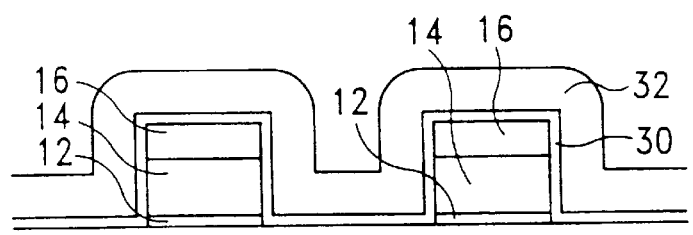
FIG. 2c illustrates a cross sectional view of forming a first insulation layer on the protection layer in the present invention.
Figure 2D:
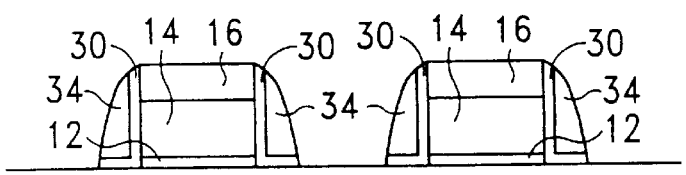
FIG. 2d illustrates a cross sectional view of forming side wall spacers on the substrate in the present invention.
Figure 2E:
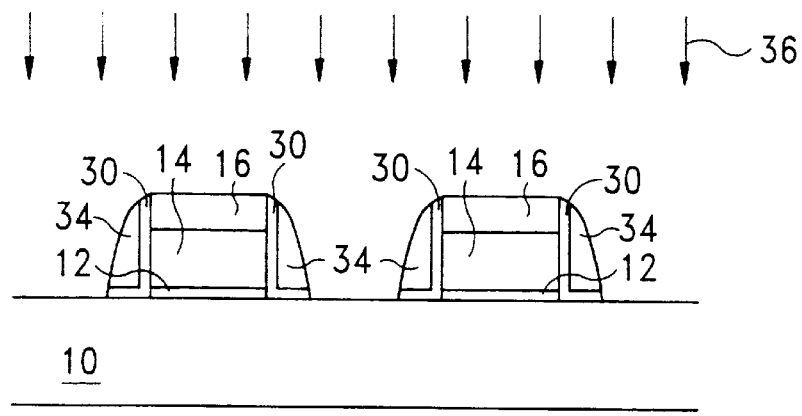
FIG. 2e illustrates a cross sectional view of performing an ion implantation to the substrate in the present invention.
Figure 2F:
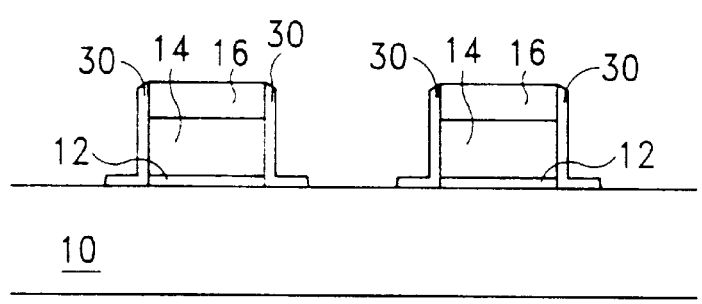
FIG. 2f illustrates a cross sectional view of removing side wall spacers on the substrate in the present invention.
Figure 2G:
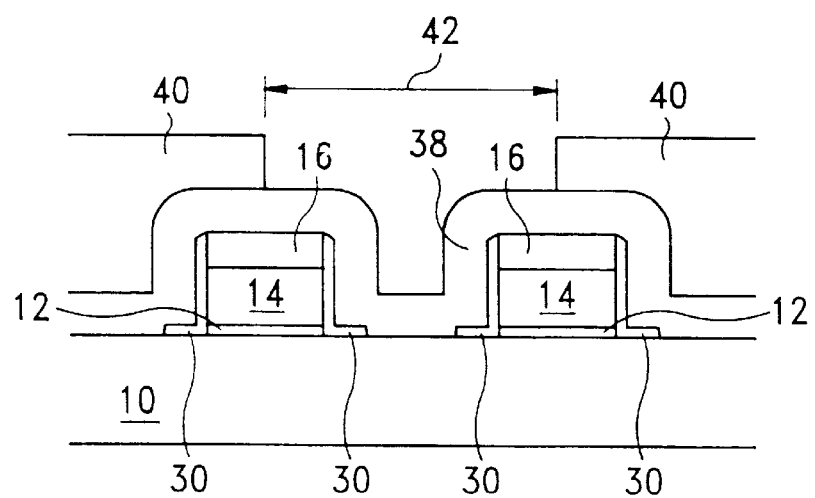
FIG. 2g illustrates a cross sectional view of forming second insulation layer and patterning a photoresist on the second insulation layer in the present invention.
Figure 2H:
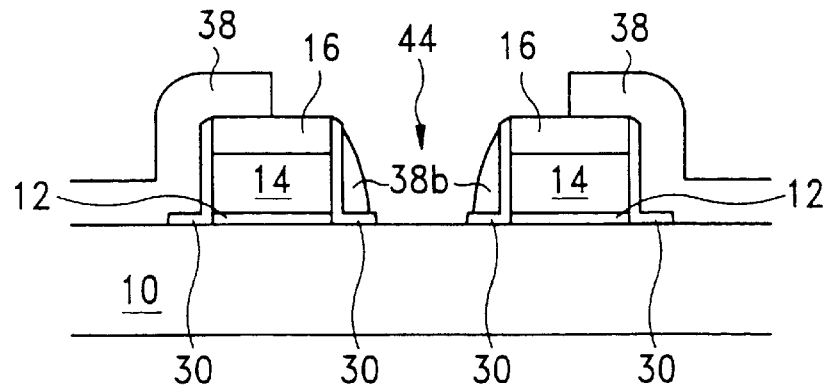
FIG. 2h illustrates a cross sectional view of forming a contact window to the substrate in the present invention.

The present invention provides a method of forming a contact window 44 between the gates as shown in FIG. 2h. The method employed forming a protection layer formed on the side walls of a gate structure. The protection layer eliminates the unreliability and low yield with the over etching in conventional processes. The method can further includes a step of removing side wall spacers for making a wider contact window. The spaces between the gates can be narrowed and the design rule is changed in increasing the integrity of the integrated circuits.

FIG. 2a shows a semiconductor substrate 10 with a gate structure 11 formed upon. The gate structure 11 has a gate oxide, 12 a gate electrode 14 formed above the gate oxide, and a gate electrode protection layer 16 formed above the gate electrode 14. The formation of the gate structure 11 is well known in the art of semiconductor manufacturing process. A protection layer 30 is formed conforming with the substrate 10, the gate oxide 12, the gate electrode 14, and a gate electrode protection layer 16, as shown in FIG. 2b. The protection layer 30 is a thin layer of insulating materials to insulate the gate electrode 14 from current leakage or short connections with a connection layer formed later. In the preferred embodiment, the protection layer 30 formed by deposition is generally several thousand angstroms in thickness and the thickness can be varied with different specifications. Following with the forming of the protection layer 30, a first insulation layer 32 is formed on the protection layer 30. The first insulation layer 32 is formed by depositing a layer of insulation materials. The material of first insulation layer is selected for having a high selectivity to the protection layer 30 in etching. Taking the materials frequently applied in the present semiconductor manufacturing process as an example, if silicon dioxide ($SiO_2$) is employed as the first insulation layer 32, silicon nitride ($Si_3N_4$) can be employed as the protection layer 30 for having a high etching selectivity. An etching process is then performed for forming the side wall spacers 34 on the side walls of the gate electrode 14 as shown in FIG. 2d. In addition to the protection layer 30, the first insulation layer 32 around the gates can further protect the gates from possibility of leakage and short by over etching.

An ion implantation process to substrate 10 is applied using the gate structure 11 and the side wall spacers 34 as a mask for forming active regions like source or drain regions. Then, the side wall spacers 34 can be removed by an etching process with the protection layer 30 as an etching stop layer as shown in FIG. 2f. A wet etching process can be employed for removing the side wall spacers 34. Under a relative high selectivity of the side wall spacers 34 to the protection layer 30, the protection layer 30 serves as an etch stop in the etching process. For example, the hydrofluoric acid (HF) can be applied to etch the side wall spacers 34 of silicon dioxide with a relative low etching rate to the protection layer 30 of silicon nitride. The protection layer 30 is a good etch stop which protects the gate electrode 14 for preventing over etching during the process. The removing of the side wall spacers 34 provides a wider space between the gates than a conventional SAC process for making following steps. The protection layer 30 prevents the gate electrode 14 from short connections with subsequent layers.

Following with the removing of the side wall spacers 34, a second insulation layer 38 is then deposited on the substrate 10, the protection layer 30, and the gate electrode protection layer 16, as shown in FIG. 2g. The second insulation layer 38 is an IPD (inter-polysilicon dielectric) layer and insulates the gates and other non connecting regions from making conductive connections. The second insulation layer 38 can be materials with good insulation. A silicon dioxide is used in the preferred embodiment. A photoresist layer 40 is patterned on the second insulation layer 38 for defining a connecting region 42 and exposing a portion of the second insulation layer 38 as shown in FIG. 2g.

An etching process employing photoresist layer 40 as a mask is performed to etch the second insulation layer 38. The photoresist layer 40 is removed after the etching process. As shown in FIG. 2h, the etching process is an anisotropic etching process and a contact window 44 are defined by controlling the etching of the second insulation layer 38. The process is self-aligned without a mask for defining the contact window. An unetched portion of the second insulation layer 38 is left aside the gate structure 11 and above the protection layer 30 as second side wall spacers 38b. The second side wall spacers 38b protect the gate electrode 14 without narrowing the width of the contact window 44. Thus the problem of a narrow contact window in the conventional SAC process caused by the unetched portion of the second insulation layer is eliminated.

Figure 2I:
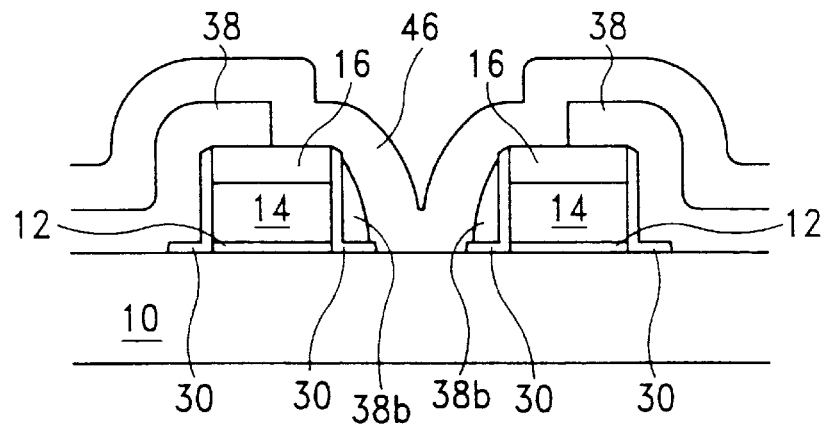
FIG. 2i illustrates a cross sectional view of forming a connection layer within the contact window and on the substrate in the present invention.
Figure 2J:
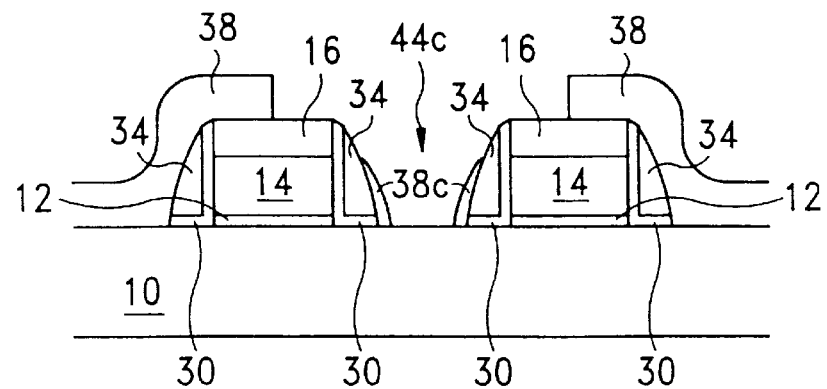
FIG. 2j illustrates a cross sectional view of forming a contact window to the substrate without removing the side wall spacers in the present invention.

If the criteria on contact window width between the gates for making a conductive connection is not very critical, the step of removing the side wall spacers 34 can be omitted for balancing time and production cost. After the ion implantation process, the same process as aforemetioned process is then followed. A contact window 44c is formed by forming and removing a portion of the second insulation layer 38. As shown in FIG. 2j, a slightly narrower contact window 44c is formed, leaving an small unetched portions 38c of the second insulation layer 38. Since the method of the present invention includes a protection layer 30, the etching of the second insulation layer 38 can be thoroughly in depth worrying an over etching. Thus only a very small portion 38c is left and a wider contact window than conventional SAC process can still be achieved.

Therefore, a contact window to an active region on the substrate like a source region or a drain region for making conductive connections is formed. Following with the forming of the contact window 44 or 44c, a conductive connection layer 46 is then deposited to fill the contact window 44 or 44c as a conductive connection to the active regions, as shown in FIG. 2i. The conductive connection layer 46 is generally a conductive layer and materials like metals, doped polysilicon, or other conductive materials can be used. In the method of the present invention, the protection layer covering the gate provides an etch stop and protects from current leakage or short connections. Thus no over etching can be found to influence the electrical characteristics of the circuits. The process of etching can be well controlled. The reliability of the device is raised under lower possibilities of undesired shorts. The removing of the side wall spacers provides a wider contact window with lower contact resistance than conventional SAC technology. The space between gates can be reduced with the same line width. The integrity of the integrated circuits can be raised by a narrower space between the gates with the self-aligned method in the present invention. The contact window width can be controlled accurately without an additional mask. The present invention changes the design rule in determining the space between the gates and higher integrity can be achieved together with better reliability and reduction in cost.

As is understood by a person skilled in the art, the foregoing description of the preferred embodiment of the present invention is illustrative of the present invention rather than a limitation thereon. It is intended to cover various modifications and similar arrangements included within the spirit and scope of the appended claims, the scope of which should be accorded with the broadest interpretation so as to encompass all such modifications and equivalent structure.

What is claimed is:

1. A method of forming a contact window on a substrate, said method comprising the steps of:

forming a gate structure on said substrate, said gate structure having a gate oxide, a gate electrode formed above said gate oxide, and a gate electrode protection layer formed above said gate electrode;

forming a protection layer conforming with said substrate and said gate structure;

forming a first insulation layer on said protection layer;

removing a portion of said first insulation layer and a portion of said protection layer for forming side wall spacers on side walls of said gate structure;

performing an ion implantation of impurities to said substrate, using said gate structure and said side wall spacers as a mask;

removing said side wall spacers;

forming a second insulation layer on said substrate, said side wall spacers, and said gate structure;

patterning a photoresist layer on said second insulation layer to expose a portion of second insulation layer for making a connection; and removing a portion of said second insulation layer using said photoresist layer as a mask for forming a contact window.

2. The method of claim 1 and further comprises a step of filling said contact window by depositing a conductive layer after said contact window is formed.

3. The method of claim 1, wherein said first insulation layer is selected for having a high etching selectivity to said protection layer.

4. The method of claim 3, wherein said protection layer is formed by depositing a silicon nitride layer.

5. The method of claim 4, wherein said first insulation layer is formed by depositing a silicon oxide layer.

6. The method of claim 1, wherein said second insulation layer is formed by depositing a silicon oxide layer.

7. The method of claim 1, wherein said step of removing said side wall spacers are performed by a wet etching using said protection layer as an etch stop.

8. The method of claim 1, wherein said step of removing a portion of said second insulation layer is a self-aligned etching process using said photoresist layer as a mask.

9. A method of forming a contact window on a substrate, said method comprising the steps of:

forming a gate structure on said substrate, said gate structure having a gate oxide, a gate electrode formed above said gate oxide, and a gate electrode protection layer formed above said gate electrode;

forming a protection layer conforming with said substrate and said gate structure, said protection layer is formed by depositing a silicon nitride layer;

forming a first insulation layer on said protection layer, said first insulation layer is selected for having a high etching selectivity with said protection layer, said first insulation layer is formed by depositing a silicon oxide layer;

removing a portion of said first insulation layer and a portion of said protection layer for forming side wall spacers on side walls of said gate structure;

performing an ion implantation of impurities to said substrate, using said gate structure and said side wall spacers as a mask;

removing said side wall spacers by a wet etching process, using said protection layer as an etch stop;

forming a second insulation layer on said substrate, said side wall spacers, and said gate structure, said second insulation layer is formed by depositing a silicon oxide layer;

patterning a photoresist layer on said second insulation layer to expose a portion of second insulation layer for making a connection; and removing a portion of said second insulation layer by a self-aligned etching process using said photoresist layer as a mask, for forming a contact window.

10. The method of claim 9 and further comprising a step of filling said contact window by depositing a conductive layer after said contact window is formed.

* * * * *